United States Patent [19]
Prevost et al.

[11] Patent Number: 4,752,911
[45] Date of Patent: Jun. 21, 1988

[54] READ/WRITE DEVICE USING MODULAR ELECTRONIC MEMORY

[75] Inventors: Jacques Prevost, Chatou; Guy Giraudet de Boudemange; Guy Christol, both of Paris, all of France

[73] Assignee: Electronique Serge Dassault, Paris, France

[21] Appl. No.: 818,608

[22] Filed: Jan. 13, 1986

[30] Foreign Application Priority Data

Jan. 17, 1985 [FR] France ............... 85 00671

[51] Int. Cl.$^4$ ............................................. G11C 13/00
[52] U.S. Cl. ................................. 365/52; 365/51
[58] Field of Search ............... 365/52, 189, 230, 51

[56] References Cited

U.S. PATENT DOCUMENTS

4,454,552  6/1984  Barnes et al. ............... 361/9

FOREIGN PATENT DOCUMENTS

2344201  3/1977  France .
2385239  3/1978  France .

OTHER PUBLICATIONS

IBM Technical Disclosure Bulletin vol. 23, No. 5, Oct. 1980, pp. 1748–1750, "Solid State Cartridge System".

IBM Technical Disclosure Bulletin vol. 1, No. 2, Aug. 1958 "Compensating Hinge", p. 8.

IBM Technical Disclosure Bulletin vol. 25, No. 4, Sep. 1982, pp. 1980–1981, "Low Cost Cartridge Code Detector".

*Primary Examiner*—Terrell W. Fears
*Attorney, Agent, or Firm*—Christie, Parker & Hale

[57] ABSTRACT

A box (100) includes one or more housings (130) each of which is capable of receiving a memory module (MM). The memory modules have longitudinally extending side grooves and the housings are provided with corresponding module-guiding tongues (111) and 112). The back of each module includes orifices for engaging centering pegs (PC11 and PC12) to ensure that a male connector portion (C1) on the memory module is properly engaged with a female connector portion (C2) which is cushion-mounted at the back of each housing. A switch (IC10) detects when a module is fully inserted and the connectors are properly engaged. Complete insertion of a memory module is ensured by means of a toothed sector (121) engaging a rack segment (SC21) located at the front of one of the grooves. The toothed sector (121) is actuated by a lever (125) which closes across the front of the housing (130) and is locked in place by means of a screw (128) having a knurled knob (127).

14 Claims, 9 Drawing Sheets

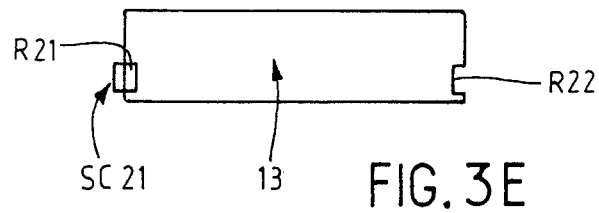
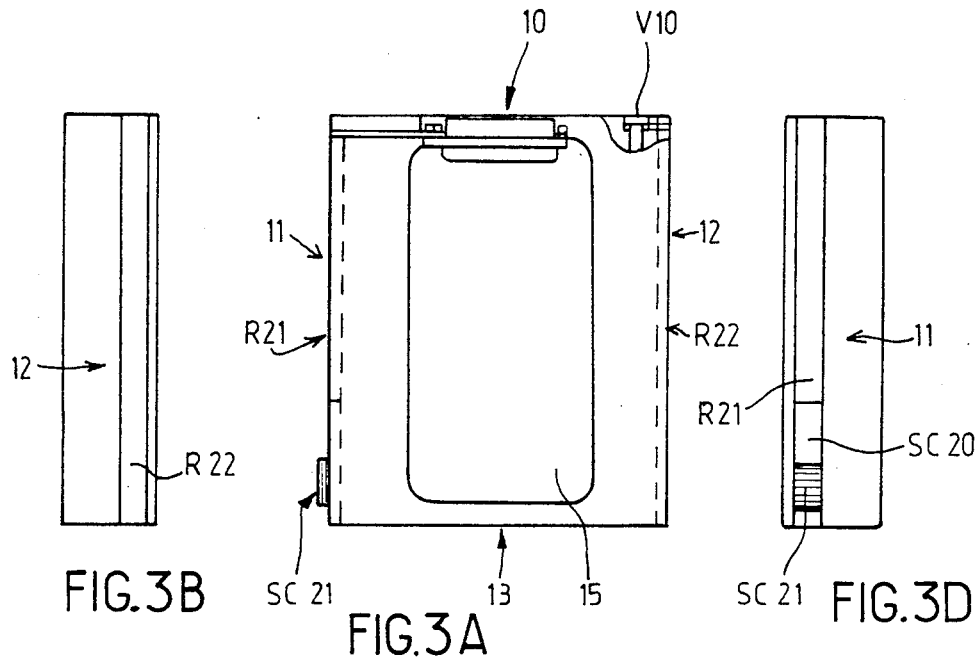
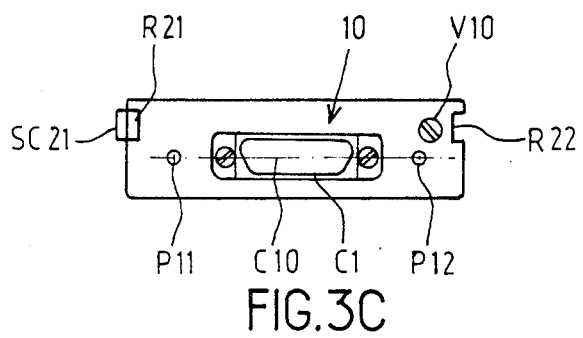

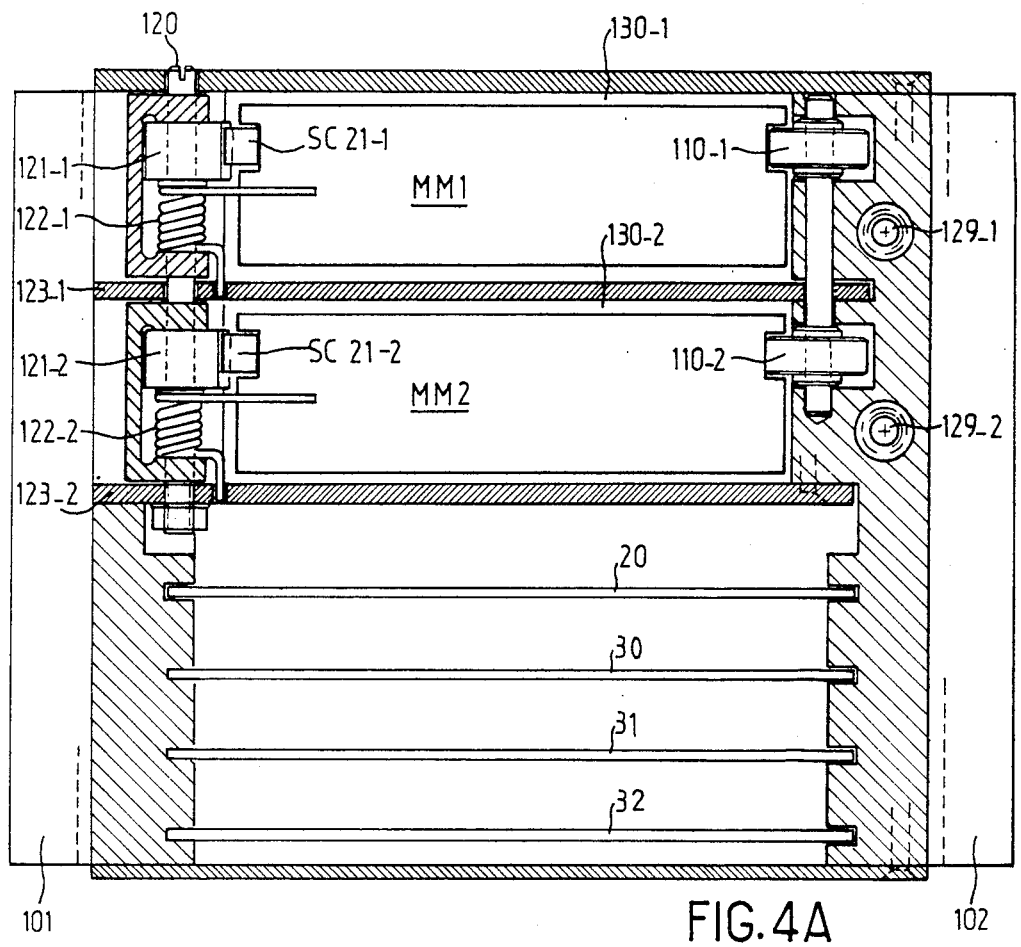
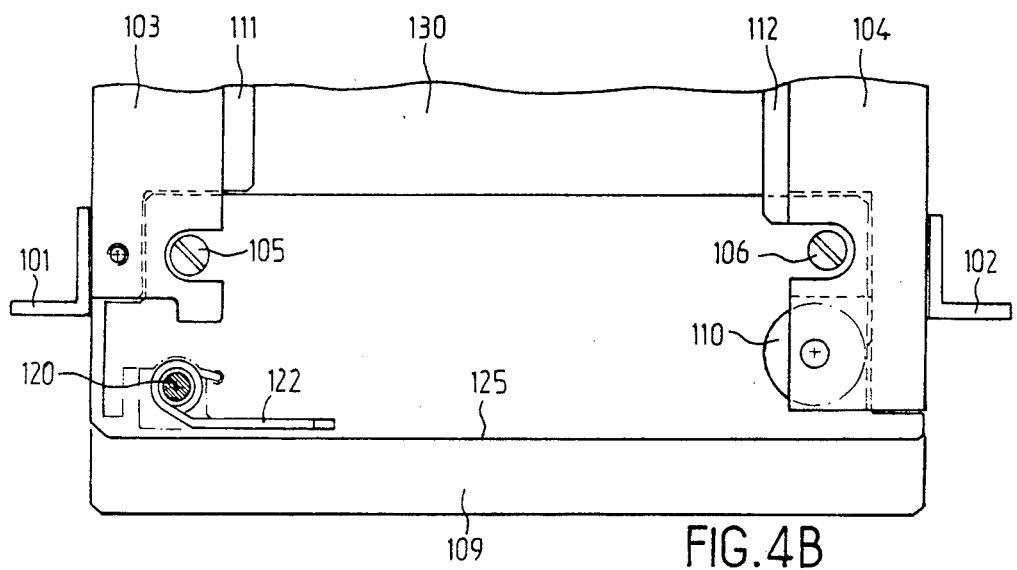
FIG.4A
FIG.4B

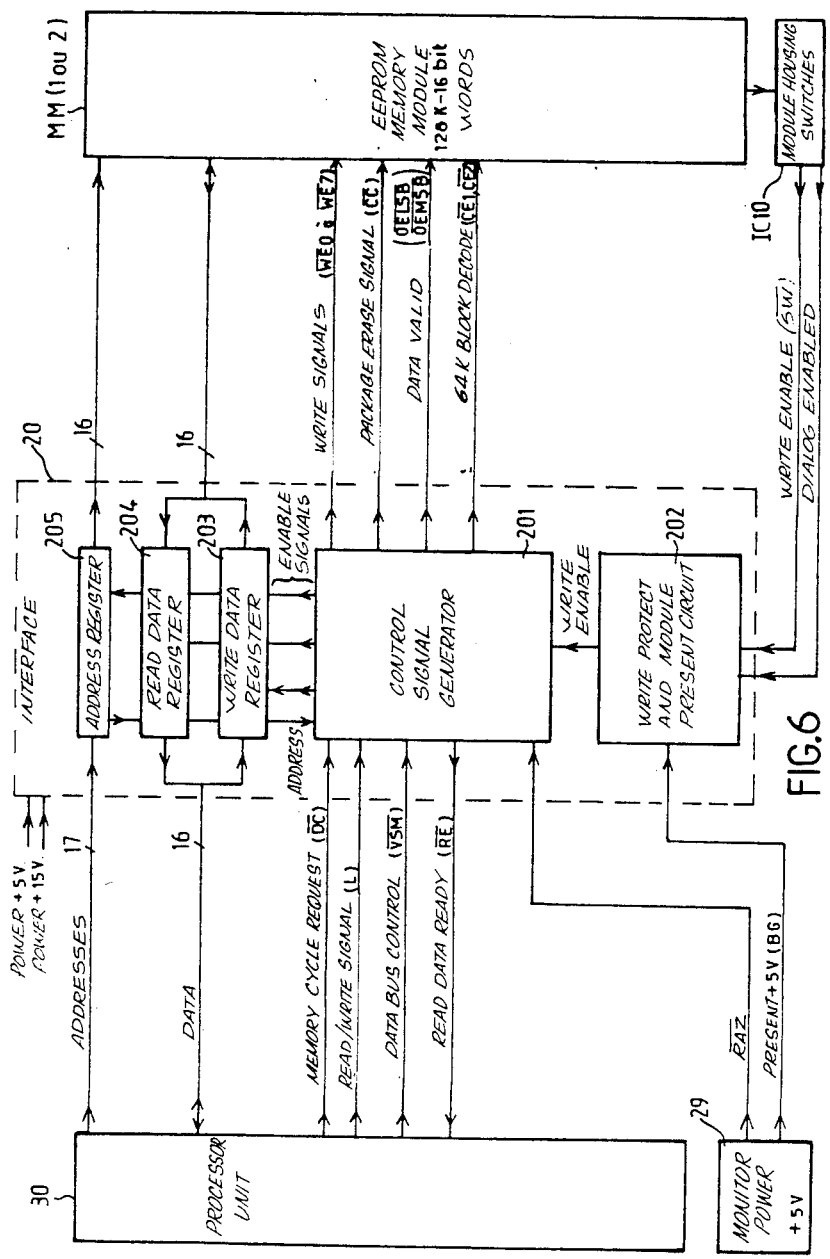

READ/WRITE DEVICE USING MODULAR ELECTRONIC MEMORY

The invention relates to memory units usable in electronic circuits.

BACKGROUND OF THE INVENTION

The Assignee has observed that it is becoming desirable in many applications to use modular memory units which are easily removed.

Magnetic memory cassettes have this property. However the access time to information stored thereon is prohibitive.

Other magnetic memories such as floppy disks or removable hard disks are no better, since although their access time is better, they require certain precautions to be taken in use and storage which makes them unusable in practice.

There are also electronic memories, i.e. memories in which input/output to the physical memory element takes place by way of electrical signals. Devices of this nature exist; however they do not provide a large memory capacity nor do they provide the high degree of security required in some of the applications in which the Assignee is interested, such as aviation.

In particular, rather than increasing the capacity of the central memory of onboard computers, the Applicant considers it to be preferable to use modular mass memories which can be used both on the ground and in an aircraft, and which are capable of being loaded via a bus.

The basic problem is thus to provide modular mass memories having a capacity of at least one megabit and which are greatly extensible. This problem is complicated by the fact that such memories must be highly reliable, compact, and must above all continue to perform well under extreme environmental conditions, e.g. $-55°$ C. to $+125°$ C. temperature range while being subjected to a high level of vibration.

Preferred implementations of the present invention provide a solution to this problem.

SUMMARY OF THE INVENTION

In conventional manner, the present invention makes use of a device for recording and for reading data, in which a modular electronic memory component in the form of a flat rectangular package is put into cooperation with a read/write apparatus provided with a housing suitable for receiving said package.

According to various aspects of the invention:

the memory component is constituted by hybrid integrated circuits fitted with electronic memory chips providing a capacity of at least 0.25 megabits;

the package includes a rear portion having a male connector connected to its internal hybrid circuits, and including at least eight data pins, fifteen address pins, four write pins, together with power supply pins, erase pins, and enable pins;

said male connector being suitable for co-operating with a corresponding female connector having a cushioned mounting at the bottom of the housing in the read/write apparatus;

the package includes slideways on its small side faces, which slideways are at least partially electrically conductive and are suitable for co-operating with guide members disposed facing them in said housing, and provided with conductive portions coming into contact with the conductive portions of the slideways and connected to apparatus ground;

co-operating centering means being provided on the package and in the apparatus housing on either side of their respective connectors;

the memory package includes, at the front end of one of its slideways, a rack segment suitable for co-operating with a segment of a toothed wheel rotatable mounted and oppositely disposed in the read/write apparatus, which apparatus further includes means for controlling the toothed wheel enabling the memory package to be put into place and to be extracted; and the read/write apparatus which includes electronic means for reading from and writing to said hybrid circuits, is provided with at least one detector for detecting the presence of a memory package in the fully inserted position, said detector preventing any data writing operations to the memory package when not fully inserted, and preferably preventing any data interchange therewith when not fully inserted.

In the embodiment presently preferred by the Assignee, the chips are EEPROM type memories together with buffer write registers, and they are organized into words of at least 8 bits. In an advantageous embodiment, the chips are organized as at least 128 16-bit kilowords, i.e. 2 megabits.

The slideways are preferably placed in a main plane of the connector, i.e. in a plane parallel to the plane defined by the central axis of the connector and its long dimension. The slideways are then constituted by side grooves in the package which co-operate with matching tongues in the housing.

The housing in the apparatus preferably includes at its inlet and opposite to the toothed wheel segment, a freely-mounted wheel suitable for co-operating with the package slideway that does not have a rack.

The means for controlling the segment of toothed wheel are advantageously constituted by a lever fitted with resilient return means to the open position and suitable for being received and fixed on the front face of the apparatus in the closed position; the centering means, which are preferably placed in the vicinity of the above-mentioned main plane, typically comprise pegs in the housing suitable for co-operating with orifices in the package.

The memory package presence detector may be advantageously housed within one of said pegs, or in the vicinity thereof.

According to another aspect of the invention, the memory package includes a two-position member, and a feeler suitable for detecting the position of said member is provided in the housing, said member being advantageously constituted by a screw mounted at the back of the package. This screw serves to indicate whether writing to the memory module is authorized or not, or it may serve for other purposes of the same kind.

Naturally, the read/write apparatus may include a plurality of adjacent housings suitable for receiving a corresponding number of respective memory modules.

The electronic read/write means incorporated in the apparatus comprise at least one interface module for the, or each, memory module, and a unit for connection with an external bus.

This type of memory has the advantage of being directly addressable as random access memory (RAM). This possibility, associated with the use of a processor unit having its own memory makes it possible for the memory modules to be locally controlled, with the processor unit then having access to the memory modules by direct addressing, by indirect addressing, or by file addressing.

BRIEF DESCRIPTION OF THE DRAWINGS

An embodiment of the invention is described by way of example with reference to accompanying drawings, in which:

FIGS. 3A to 3E are five corresponding views of a memory module in accordance with the invention;

FIGS. 4A and 4B are two views of the read/write apparatus in accordance with the invention, with FIG. 4A being an elevation view in partial section and FIG. 4B being a plan view;

FIG. 6 is a block diagram of the electronic read/write means incorporated in the apparatus in accordance with the invention;

MORE DETAILED DESCRIPTION

Figure 1:
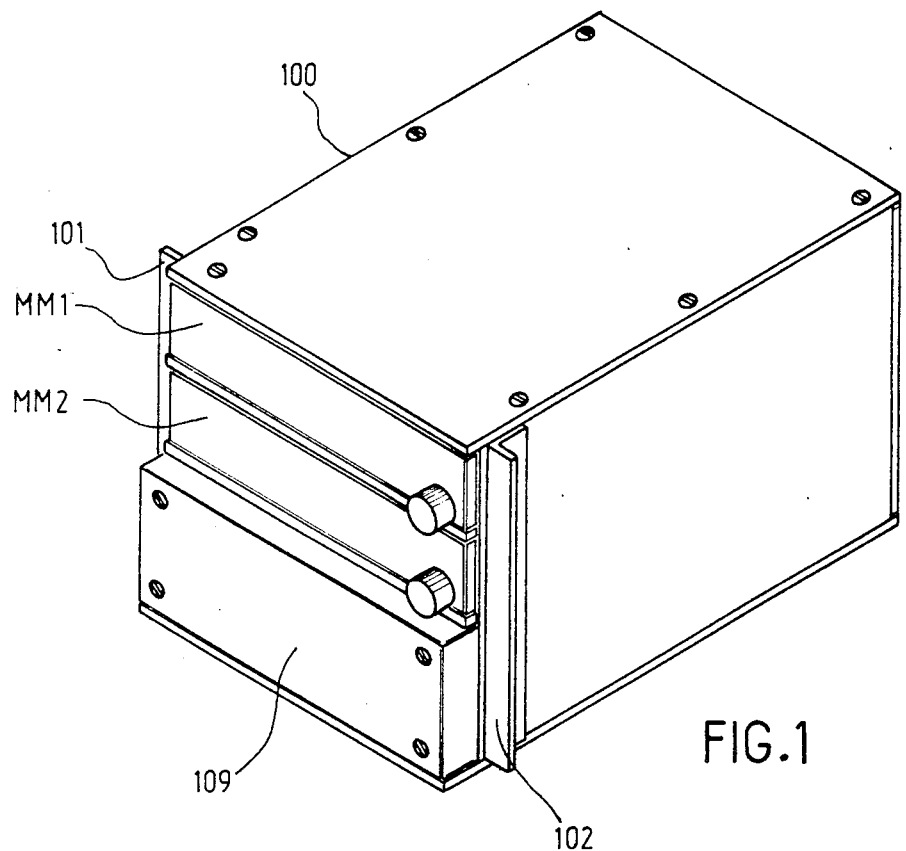
FIG. 1 is a diagrammatic perspective view of a read/write device in accordance with the invention, and including two memory modules.

In FIG. 1, the read/write apparatus comprises a box 100 which is generally rectangular in shape and fitted with brackets 101 and 102 on either side of its front face. The top of the front face of the box is open to define two inlets to two housings suitable for receiving respective memory modules MM1 and MM2. The bottom of the front face is closed by cover 109 behind which the electronic read/write unit of the apparatus is to be found.

Figure 2:
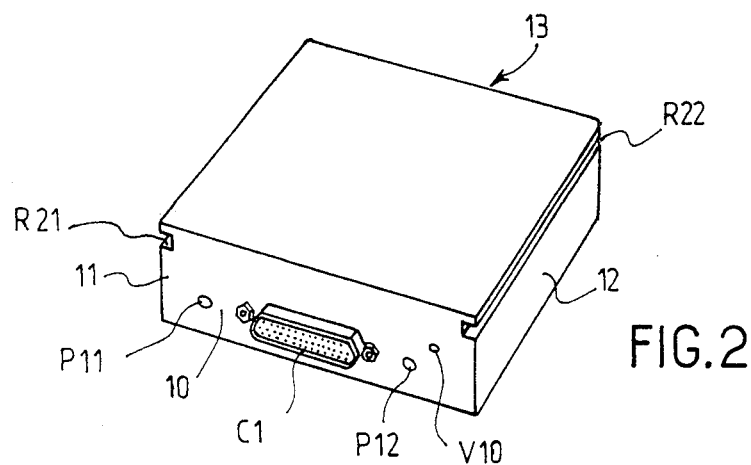
FIG. 2 is a perspective view of a memory module in accordance with the invention.

Reference is now made to FIGS. 2 and 3 in order to describe a memory module.

A memory module comprises a generally rectangular package having a front face 13, a back face 10 on which a connector element C1 is provided, and two side faces 11 and 12. The package is closed by a bottom face and by a top face which are not shown.

The connector element C1 may be a Cannon MDVB 1-51P type connector. This Cannon connector includes 51 male pins. Because of its general trapezium shape with rounded corners, no other electrical keying means is required.

The main plane of the connector is marked by a line C10 on FIG. 3C. This line which passes through the fixing points of the connector C1 extends parallel to the long dimension thereof.

In this main plane C10 there are two orifices P11 and P12 disposed on either side of the connector C1.

FIG. 3C also shows two side grooves R21 and R22 which the module includes in its side walls 11 and 12. Together these grooves define a plane parallel to the above-mentioned main plane.

One of these grooves, in this case the groove R21, includes a part SC20 located near to the front 13 of the module and defining a rack-shaped projection SC21 which can be seen to project beyond the side wall 11 in FIGS. 3A, 3C and 3E.

Finally, the back face of the memory module has a screw V10 capable of taking up two positions. In one of these positions the screw is retracted into the module. In its other position it projects from the rear face 10 of the module. This screw can be used, for example, to indicate whether writing into the module is authorized, or not, by co-operating with a switch such as IC10 (see FIG. 5).

Figure 5:
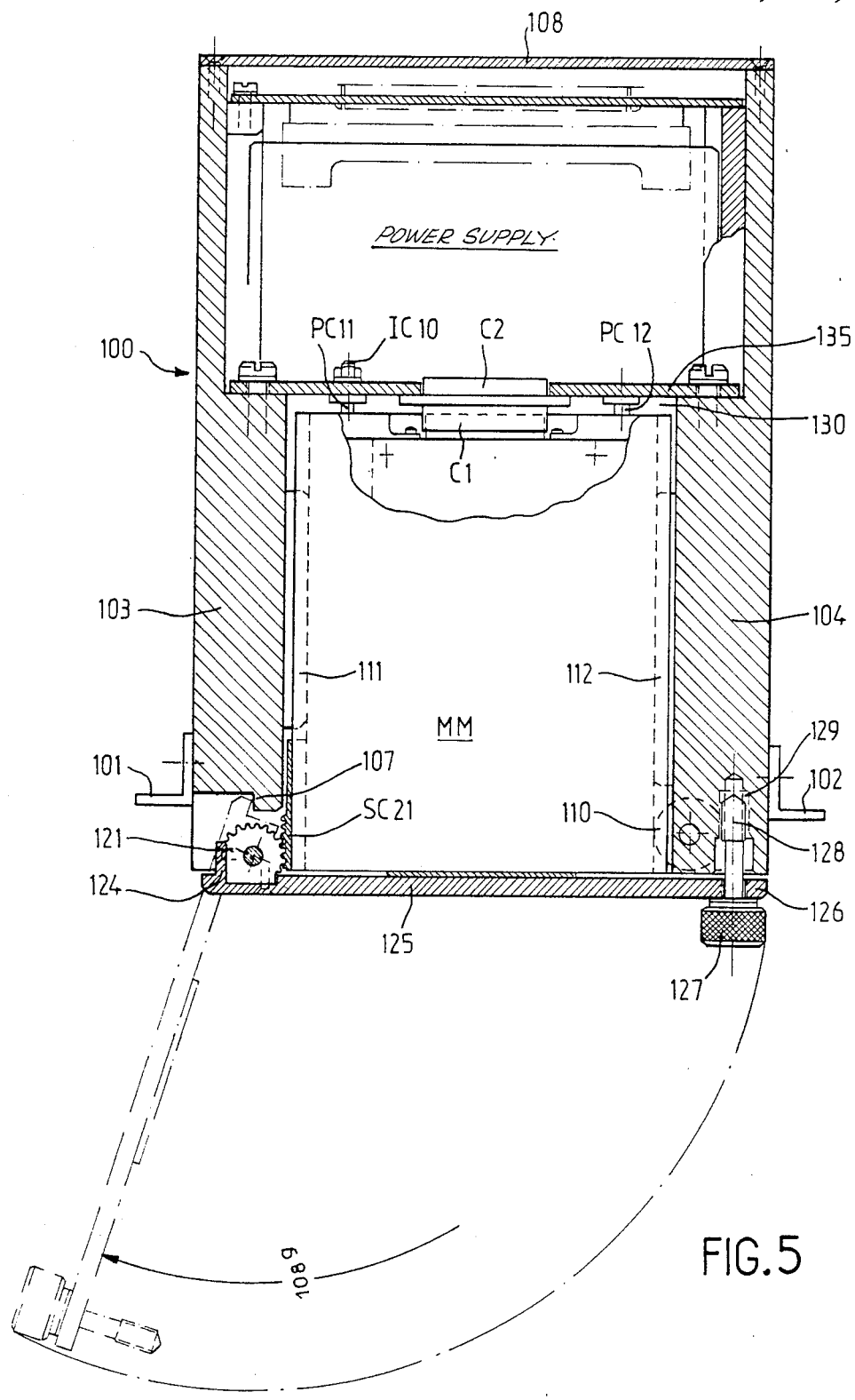
FIG. 5 is another plan view with the top cover removed showing the apparatus in accordance with the invention.

Reference is now made to FIGS. 4A, 4B and 5, together with FIG. 1.

In FIG. 4A, the cover 109 has been removed, thereby revealing four printed circuit boards 20, 30, 31, and 32 which correspond respectively to an interface, to a processor unit, to memory circuits, and to a circuit for connection to a bus.

Above the printed circuit boards (PCBs) two memory modules MM1 and MM2 are shown in their respective housings 130 (in FIG. 4B the memory module has been removed).

The chassis of the apparatus includes two side risers 103 and 104 having tongues 111 and 112 fixed thereto and suitable for coming into co-operation with the grooves R21 and R22 of a memory module. The tongue 111 stops short first at the front in order to leave room for the rack segment SC21 on the inserted module. A memory module is thus guided in translation along a plane which is parallel to the main plane of its connector C1 (see FIG. 5).

The connector is thus brought to the vicinity of a connector component C2 which is cushion mounted on a plate 135 at the back of the apparatus 100, with said plate defining the back of the housings.

The plate 135 is also provided with two centering pegs PC11 and PC12 capable of entering the orifices P11 and P12 of a memory module so as to begin insertion of the male connector portion C1 into the female connector portion C2.

Advantageously, a switch IC10 (see FIG. 5) is provided inside one of the centering pegs PC11 or in the immediate vicinity thereof, in order to determine whether the male connector portion C1 of a memory module is fully inserted into the female connector portion C2 of the apparatus 100.

IC10 is, for example, a switch such as the type 83 1295 switch sold by the CROUZET corporation whose contact is open when the module is absent and is closed by the module when it is in place (or vice versa).

Power supply circuits are located between the back plate 135 of the apparatus and the back plate 108 of a memory module, which power supply circuits may be of known type and suitable for providing +5 volts and +/− 15 volts (see FIG. 6).

Each memory module housing in the apparatus is provided with a freely mounted wheel 110-1 or 110-2 located to the right and at the front of the housing.

That portion of the cross-section of each of said wheels which projects into the housing is aligned with the corresponding tongue 112. Where necessary, the wheel may be mounted using ball bearings.

To the left, each housing is provided with a toothed sector 121 which is fixed to a lever defined by a main arm 125 and a perpendicular arm 124, both of which are fixed to the non-toothed portion of the sector 121. The free end of the arm 125 is provided with fixing or closing means, e.g. as follows: a knurled knob 127 is fixed to a shaft whose threaded end portion 128 may be inserted into a bore 129 included in the riser 104 of the apparatus 100.

When the lever 125 is fully open (shown in dot dashed lines in FIG. 5) the tail 124 of said lever bears against a shoulder 107. The opening angle is then greater than a right angle, and may be equal to 108°, for example.

The lever 125 is normally urged into said open position by a spring 122 which bears against the horizontal plates 123-1 or 123-2 which delimit the housings 130. The spring 122 is wound about the shaft 120 of the toothed sectors 121 and terminates in a branch which bears against the inside face of the corresponding lever 125.

FIG. 4B also shows screws 105 and 106 which are used in mounting the internal framework which defines the housings 130-1 and 130-2 of the apparatus.

A user can insert a memory module single-handed, as follows:

the user inserts the module using a single hand so that it slides over the tongues 111 and 112 until the rack segment SC21 begins to engage the toothed sector 121. The user then lets go the module;

then by moving the lever 125, the module is pushed home to begin by receiving the centering pegs PC11 and PC12, and then to continue by engaging its male connector portion C1 into the female connector portion C2 of the apparatus, said operation being terminated when the lever 125 is fully closed, at which point it may be locked into place by screwing the screw 128 using the knurled knob 127.

This embodiment also solves the original problem as explained below.

The problem consists in providing large capacity memory modules capable of being reliable, compact, and of withstanding extreme environmental conditions.

When a memory module has a large capacity, it requires a connector having a correspondingly large number of pins.

As for the other requirements mentioned above, the Assignee has observed that the force required to use the connector is about 110 Newtons. Providing a system capable of being manipulated one-handed and which satisfies the above requirements, and in particular reliability requirements, is difficult. The present invention provides an advantageous solution to the problem.

The above description relates to the device in the position shown in FIG. 1. Naturally, the housings for the memory modules could equally well open upwardly or downwardly, if so required.

The description continues with the electronic portions of the device in accordance with the invention.

Although various other types of electronic memory may be used, the Assignee has observed that it is preferable to use hybrid circuits inside the memory modules constituted by EEPROM type integrated circuits. Such memory circuits currently enable a write cycle which lasts 1 millisecond per word, or 10 milliseconds for a group of 16 8-bit words. Further, the write cycle may be divided by 8 by writing sequentially into chips which are equipped with buffer write registers, in which case writing 128K 16-bit words into a module requires a period of about 10 to 16 seconds. The read cycle is a few hundreds of nanoseconds.

A capacity of 128K 16-bit words is easily obtained using 32 chips each having a capacity of 64K bits, and such chips are available from suppliers such as Advanced Micro Devices, Intel, Xicor, or SEEQ.

A basic capacity of 128K 16-bit words can thus be provided in a volume of 100×100×23 mm, and the base capacity may be extensible to 256K, 512K, or 1024K 16-bit words.

An embodiment of a memory module comprising 128K 16-bit words is now described with reference to FIG. 6.

FIG. 6 also shows the detailed structure of the interface 20 and of the processor unit 30.

A power supply monitoring circuit 29 generates a reset to zero signal $\overline{RAZ}$ which is addressed to a control signal generator 201 included in the interface 20. It also supplies a signal indicating the presence of +5 volts and applies this signal to the write protect circuit 202. This circuit responds to the condition in which the switch IC10 at the bottom of the module housing indicates that a module is properly inserted, thereby enabling data to be interchanged with the module (or merely enabling writing, with reading being enabled at all times). A similar switch detects the position of the screw V10.

Depending on circumstances, a write enable signal is applied or not by the protection circuit 202 to the control signal generator 201.

The control signal generator 201 is associated with three registers:

a data write register 203;

a data read register; and an address register 205.

The processor unit dialogues with the interface 20 via 17 address lines, 16 digit lines, a memory cycle request line marked $\overline{DC}$, a read/write signal line marked L, a data bus control line marked $\overline{VSM}$, and a read data available line marked $\overline{RE}$.

The interface 20 dialogues with the memory module via 16 address lines, 16 data lines, 8 write signal lines $\overline{WS0}$ to WS7, an erase signal line $\overline{CC}$, data enabling lines, one of which relates to the least significant bit (signal $\overline{OELSB}$) and the other of which relates to the most significant bit ($\overline{OEMSB}$). Finally, a decoding signal is provided for each block of 64K 16-bit words, thereby giving two signals $\overline{CE1}$ and $\overline{CE2}$.

Figure 7A:
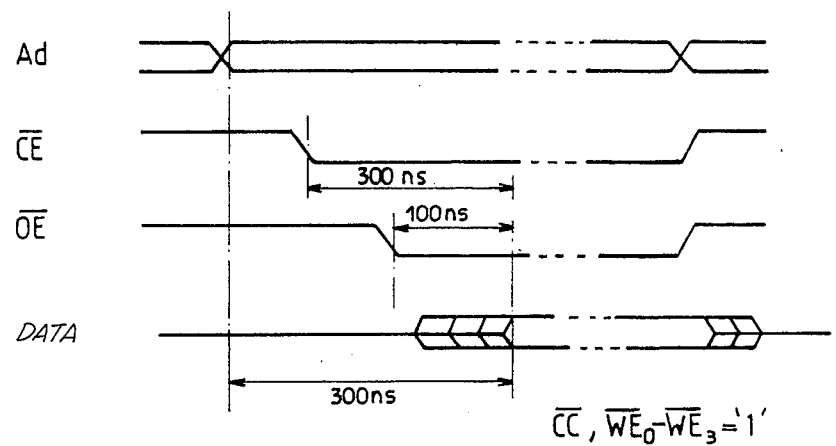
FIGS. 7A to 7C are timing diagrams relating to reading, writing, and erasure.
Figure 7B:
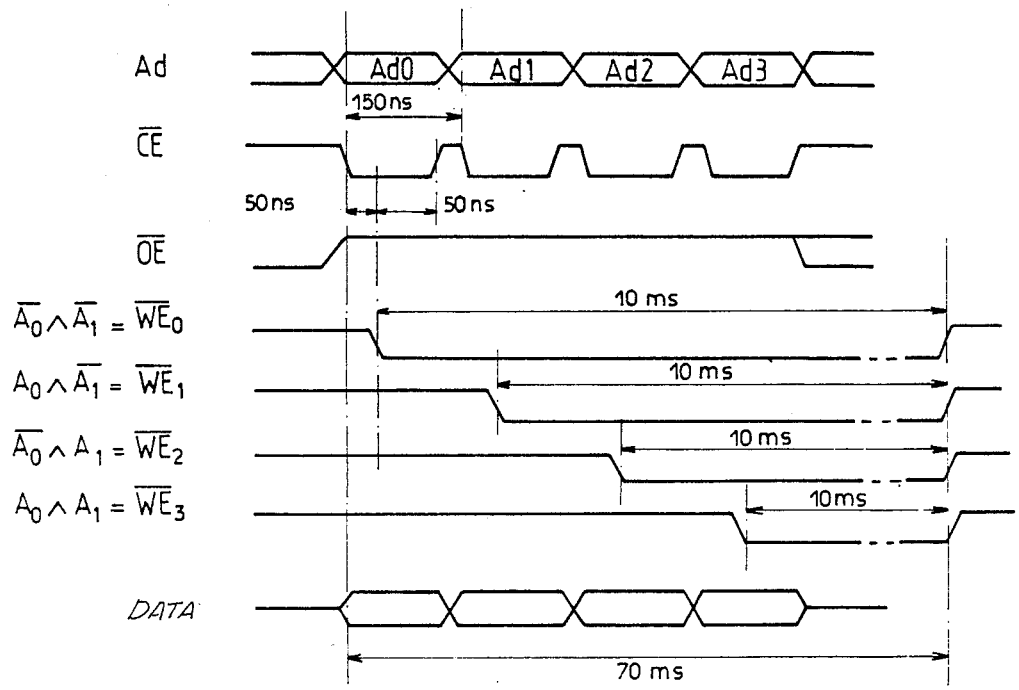
Figure 7C:
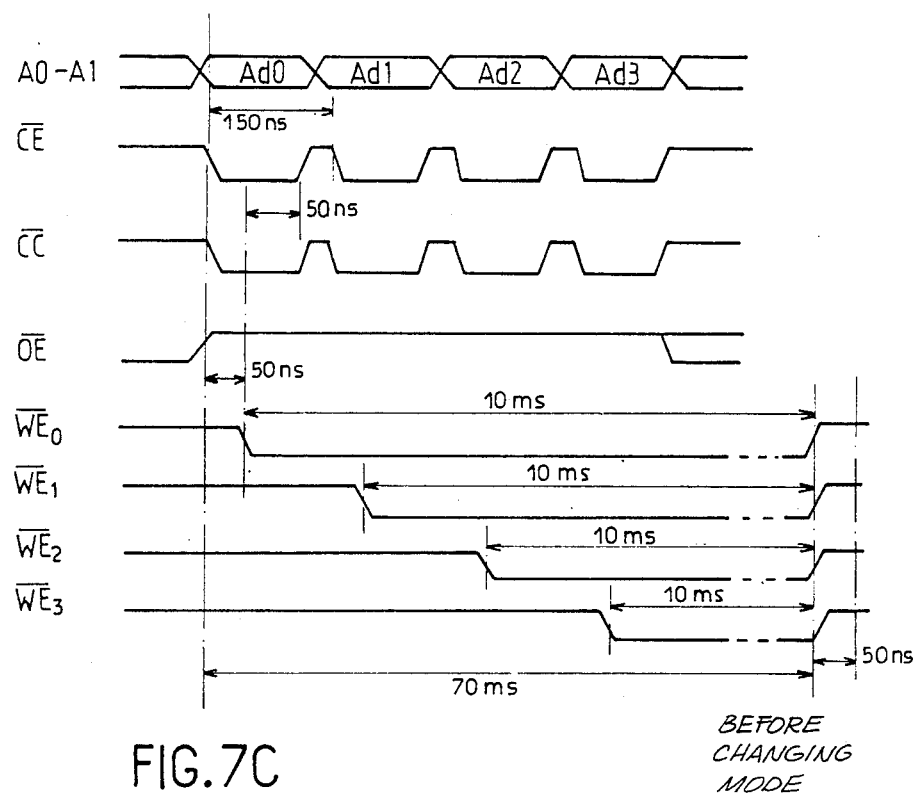

FIGS. 7A, 7B, and 7C are timing diagrams relating respectively to reading, to writing, and to erasing a memory module in accordance with the invention. These figures are incorporated in the description as being representative of the optimum way of performing the operations of reading, writing, and erasure, respectively, and may be explained as follows:

when reading (FIG. 7A)

The presence of an address, and of a low voltage on each of $\overline{CE}$ and $\overline{OE}$ causes data to appear as read from portions of the module. $\overline{CC}$ and the signals $\overline{W0}$ to $\overline{W7}$ should remain high.

when writing (FIG. 7B)

When writing, the address, the quantity to be written, and the control signals $\overline{CE}$, $\overline{CC}$, and $\overline{DE}$ are loaded into inlet registers of the EEPROM components, e.g. on a falling edge in the signal $\overline{W}$. The module receives 8 different write control signals $\overline{W0}$ through $\overline{W7}$, making it possible to write up to eight words simultaneously into the module. These signals must last for long enough to ensure that writing takes place (e.g. for 10 ms for some components).

when erasing (FIGS. 7B and 7C)

Depending on the components used, erasing, which must necessarily take place before writing, may either:

occur automatically in the memory component; or be performed as a special write cycle in which the data inputs to the component are held high.

Some EEPROM type components may be erased by package rather than word by word. FIG. 7 shows this example: the signal $\overline{CC}$ going low during a write cycle indicates that the memory component should be completely erased.

Figure 8:
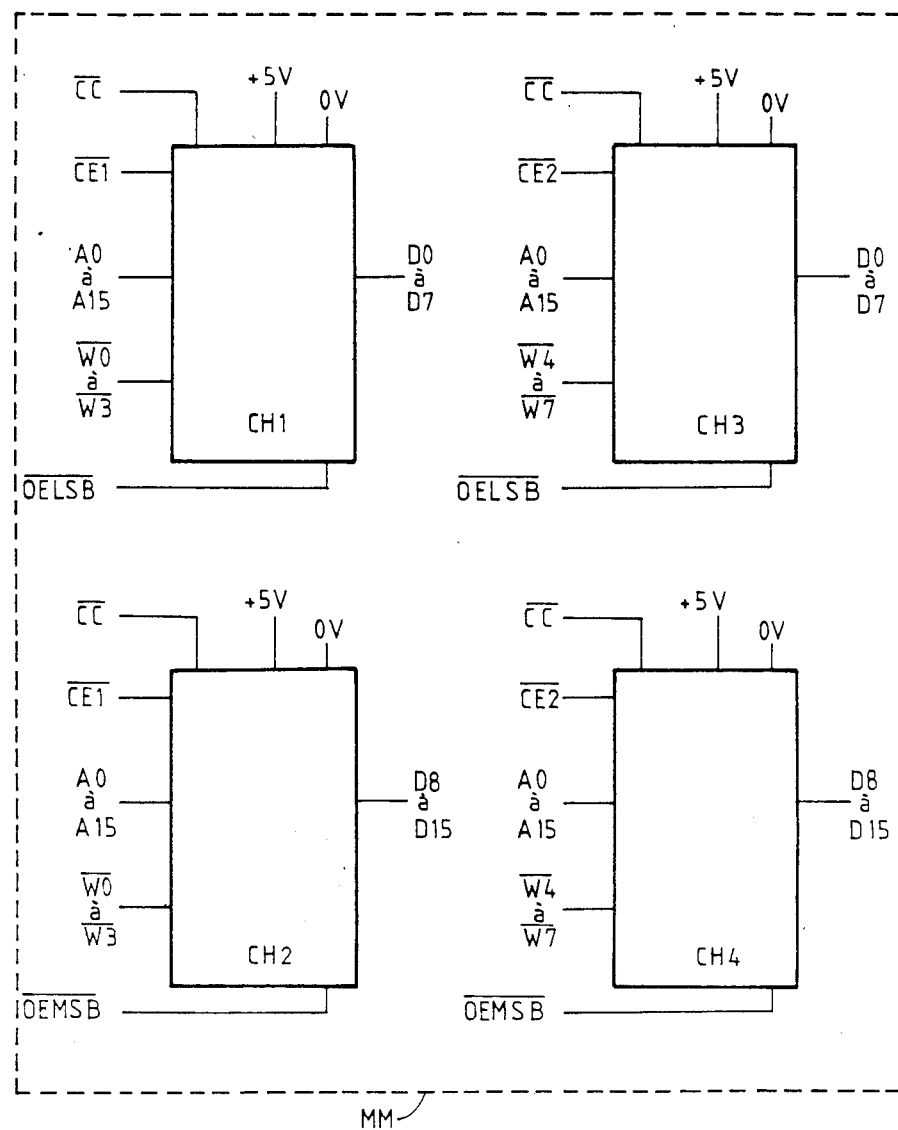
FIGS. 8 and 9 show the construction of a memory module in greater detail.
Figure 9:
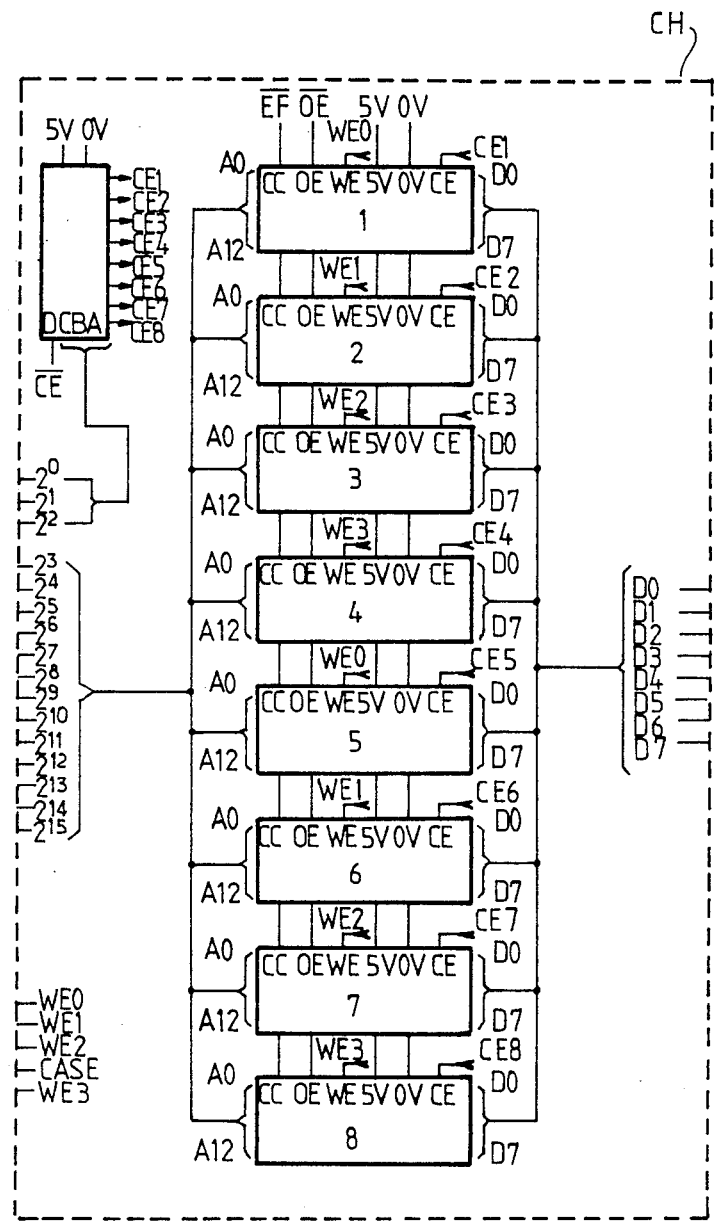

FIGS. 8 and 9 respectively show how hybrid circuits are interconnected within a module, and how chips are interconnected within a hybrid circuit.

FIG. 8 shows a module containing four hybrid circuits CH1 to CH4, each of which is built up as illustrated in FIG. 9, where:

A0-A15 are address lines;

D0-D7 (or D8-D15) are data lines;

$\overline{CE}$ is a chip enable line, and in FIG. 9 CE is combined with the first three address lines to decode selection of unit chips;

$\overline{OE}$ is an output enable line and is applicable, where appropriate for the most significant bits (MSB) or the less significant bits (LSB);

$\overline{W}$ or $\overline{WE}$ is a write enable line; and $\overline{EF}$ or $\overline{CC}$ is an erase enable line.

In a simplified version of the invention, only the interface board 20 and a board for connection to an external bus need be provided.

However, it is currently considered to be preferable to incorporate a processor unit 30 with its own memories 31 in the apparatus, in particular for local control of the contents of the memory modules.

It then becomes possible to access the memory modules not only by direct addressing, but also by various modes of indirect addressing, or even by file addressing, so long as a suitable list of files is previously written to a predetermined location in each memory module.

We claim:

1. A device for writing and reading data, said device being of the type in which a modular electronic memory unit in the form of a flat rectangular package is capable of being put into co-operation with a read/write apparatus including a housing suitable for receiving said package, the device including the improvements whereby:

said memory unit comprises a plurality of hybrid integrated circuits including electronic memory chips, and defining a memory capacity of at least about 0.25 megabits;

said package includes a male connector portion at the rear thereof, said connector portion being connected to said internal hybrid circuits and including at least 8 data pins, 15 address pins, 4 write pins, together with power supply pins, erasure pins and enable pins;

said male connector being suitable for co-operating with a corresponding female connector cushion-mounted at the end of the housing in the read/write apparatus;

said package includes slideways on its small side faces, said slideways being at least partially electrically conductive and being suitable for co-operating with guide members mounted opposite thereto in said housing and fitted with conductive portions coming into contact with the conductive portions of the slideways, and connected to the apparatus' electrical ground;

co-operating centering means are provided on the package and in the housing in the apparatus, on either side of their respective connector portions;

the memory package includes, at the front end of one of its slideways, a rack segment suitable for co-operating with a segment of toothed wheel rotatably mounted opposite thereto and in the read/write apparatus, said apparatus further including means for controlling said toothed wheel in order to insert and to extract said memory package; and said read/write apparatus which includes electronic means for reading from and for writing to said hybrid circuits, is provided with at least one presence detector for detecting when a memory package is fully inserted, said detector being connected in such a manner that when a package is not fully inserted writing data to the memory package is inhibited, and preferably all data interchange therewith is inhibited.

2. A device according to claim 1, wherein the chips are electrically erasable programmable read only memories (EEPROM) including a write buffer register and organized in words of at least eight bits.

3. A device according to claim 2, wherein the chips are organized in at least 128K 16-bit words.

4. A device according to claim 1, wherein the slideways are parallel to a main plane of the connector, and are constituted by lateral grooves in the package, which grooves co-operate with corresponding tongues in the housing.

5. A device according to claim 4, wherein the housing of the apparatus includes, at its inlet, and on the opposite side to the side provided with a segment of toothed wheel, a freely mounted wheel suitable for co-operating with the package slideway that does not include a rack portion.

6. A device according to claim 4, wherein said centering means are located substantially at said main plane and include pegs projecting into the housing and suitable for co-operating with orifices in the package.

7. A device according to claim 1, wherein the means for controlling the segment of a toothed wheel comprise a lever fitted with resilient means urging it to an open position, said lever being suitable for being fixed to the front face of the apparatus in a closed position.

8. A device according to claim 1, wherein the package includes a two-position member, and wherein feeler means are provided in said housing suitable for detecting the position of said member.

9. A device according to claim 8, wherein said two-position member is a screw mounted at the back of the package.

10. A device according to claim 8, wherein said two-position member inhibits or enables writing to the memory module, which module may contain software or data.

11. A device according to claim 1, and including a plurality of adjacent housings suitable for receiving respective memory modules.

12. A device according to claim 1, wherein the electronic read/write means include a unit which constitutes an interface with the or each memory module, and a unit for connection to an external bus.

13. A device according to claim 1, wherein the electronic read/write means include a processor unit having its own memory unit, thereby enabling the memory modules to be locally controlled.

14. A device according to claim 13, wherein the processor unit enables the memory module to be accessed by direct addressing, by indirect addressing, or by file addressing.

* * * * *